(12) United States Patent
Germiquet et al.

(10) Patent No.: US 11,979,159 B2
(45) Date of Patent: May 7, 2024

(54) DEVICE FOR CONTROLLING A CONTINUOUS-ROTATION MOTOR

(71) Applicant: The Swatch Group Research and Development Ltd, Marin (CH)

(72) Inventors: Christophe Germiquet, Prêles (CH); Jean-Jacques Born, Morges (CH)

(73) Assignee: The Swatch Group Research and Development Ltd, Marin (CH)

( * ) Notice: Subject to any disclaimer, the term of this patent is extended or adjusted under 35 U.S.C. 154(b) by 8 days.

(21) Appl. No.: 18/054,302

(22) Filed: Nov. 10, 2022

(65) Prior Publication Data

US 2023/0208409 A1 Jun. 29, 2023

(30) Foreign Application Priority Data

Dec. 24, 2021 (EP) ..................................... 21217741

(51) Int. Cl.
*H03K 3/57* (2006.01)
*H02P 5/56* (2016.01)

(52) U.S. Cl.
CPC .................. *H03K 3/57* (2013.01); *H02P 5/56* (2016.02)

(58) Field of Classification Search
None
See application file for complete search history.

(56) References Cited

U.S. PATENT DOCUMENTS

| 2020/0358380 A1* | 11/2020 | Gabrys | H02P 6/28 |
| 2022/0209558 A1* | 6/2022 | Imboden | H02J 7/0063 |
| 2022/0399838 A1* | 12/2022 | Nashiki | H02K 17/30 |
| 2023/0179128 A1* | 6/2023 | Hunter | H02P 6/28 |
| | | | 318/400.1 |
| 2023/0414294 A1* | 12/2023 | Shelton, IV | A61B 18/1445 |

FOREIGN PATENT DOCUMENTS

| EP | 3 663 871 A1 | 6/2020 |
| EP | 3 663 872 A1 | 6/2020 |
| EP | 3 664 280 A1 | 6/2020 |

OTHER PUBLICATIONS

European Search Report for EP 21 21 7741 dated May 13, 2022.

\* cited by examiner

*Primary Examiner* — Khareem E Almo
(74) *Attorney, Agent, or Firm* — Sughrue Mion, PLLC

(57) ABSTRACT

A control device (2) for controlling power supply to a continuous-rotation motor, of the horological, DC type, is arranged to generate electrical pulses with a lower supply voltage to drive the rotor. The number of pulses per time interval is a function of the load applied to the motor. A voltage divider is arranged to supply the lower supply voltage with a plurality of different values and thus the electrical pulses with a variable voltage. A logic circuit counts the numbers of electrical pulses in successive time periods; to periodically select a voltage value, from among a plurality of different values, as a function of a counted number of electrical pulses or of a succession of counted numbers of electrical pulses; and to control the voltage divider so that the latter supplies the lower supply voltage with the selected voltage value after the selection of this voltage value.

20 Claims, 4 Drawing Sheets

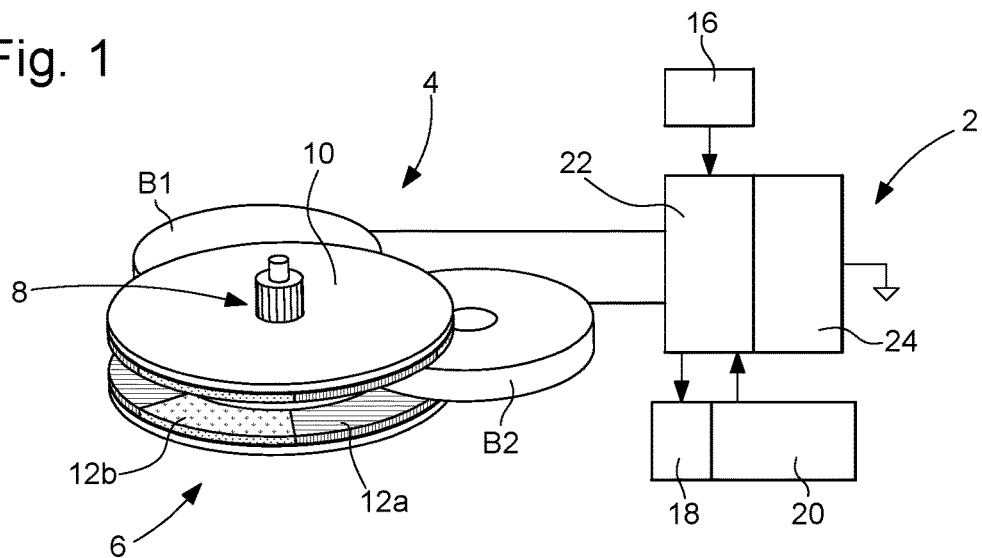
Fig. 1
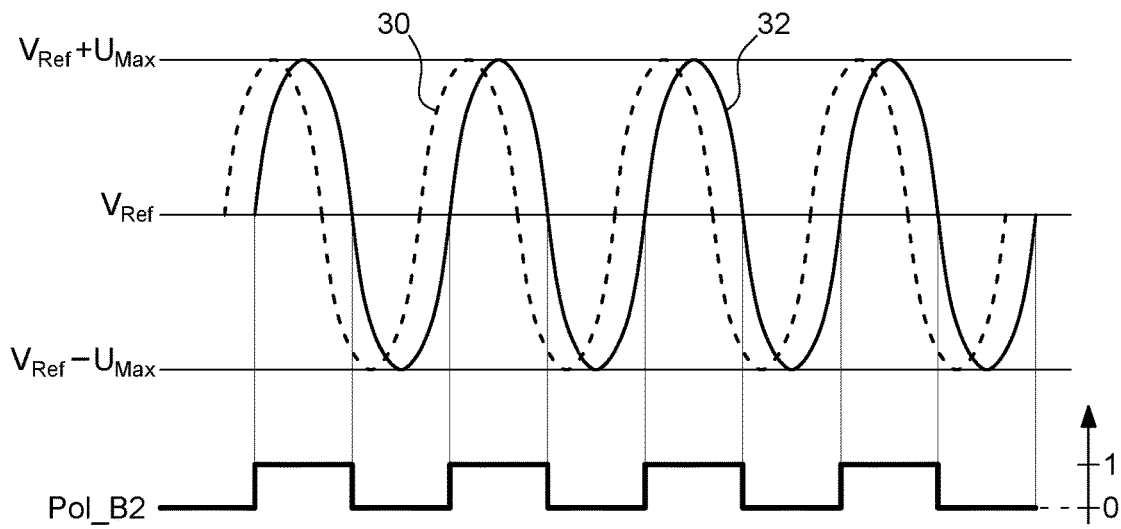
Fig. 3
Fig. 4
| Measurement mode | SM1 | SM2 | SA+ | SA0 | SA1 | SA2 | SA3 | SA4 | SA5 | SB+ | SB0 | SB1 | SB2 | SB3 | SB4 | SB5 |
|---|---|---|---|---|---|---|---|---|---|---|---|---|---|---|---|---|
| Division by 2 | X | | | | X | | | | | | | | | | | |
| Division by 3 | X | | | | X | | | | | | | | | | | |
| Division by 4 | X | | | | | X | | | | | | | | | | |
| Division by 5 | X | | | | | X | | | | | | | | | | |
| Division by 6 | X | | | | | | X | | | | | | | | | |

Fig. 5

| Generation of electrical pulses | SM1 | SM2 | SA+ | SA0 | SA1 | SA2 | SA3 | SA4 | SA5 | SB+ | SB0 | SB1 | SB2 | SB3 | SB4 | SB5 |
|---|---|---|---|---|---|---|---|---|---|---|---|---|---|---|---|---|
| Division by 2 | | | | | | | | | | | | | | | | |
| Positive pulse phase 1 | X | | | X | | | | | | X | | | | | | |
| Positive pulse phase 2 | X | | X | | | | | | | | | | X | | | |
| Division by 3 | | | | | | | | | | | | | | | | |
| Positive pulse phase 1 | X | | | X | | | | | | X | | | | | | |
| Positive pulse phase 2 | X | | | | X | | | | | | | X | | | | |
| Positive pulse phase 3 | X | | X | | | | | | | | | | X | | | |
| Division by 4 | | | | | | | | | | | | | | | | |
| Positive pulse phase 1 | X | | | X | | | | | | X | | | | | | |
| Positive pulse phase 2 | X | | | | X | | | | | | | X | | | | |
| Positive pulse phase 3 | X | | | | | X | | | | | | | X | | | |
| Positive pulse phase 4 | X | | X | | | | | | | | | | | X | | |
| Division by 5 | | | | | | | | | | | | | | | | |
| Positive pulse phase 1 | X | | | X | | | | | | X | | | | | | |
| Positive pulse phase 2 | X | | | | X | | | | | | | X | | | | |
| Positive pulse phase 3 | X | | | | | X | | | | | | | X | | | |
| Positive pulse phase 4 | X | | | | | | X | | | | | | | X | | |
| Positive pulse phase 5 | X | | X | | | | | | | | | | | | X | |
| Division by 6 | | | | | | | | | | | | | | | | |
| Positive pulse phase 1 | X | | | X | | | | | | X | | | | | | |
| Positive pulse phase 2 | X | | | | X | | | | | | | X | | | | |
| Positive pulse phase 3 | X | | | | | X | | | | | | | X | | | |
| Positive pulse phase 4 | X | | | | | | X | | | | | | | X | | |
| Positive pulse phase 5 | X | | | | | | | X | | | | | | | X | |
| Positive pulse phase 6 | X | | X | | | | | | | | | | | | | X |

Fig. 6

| Generation of electrical pulses | SM1 | SM2 | SA+ | SA0 | SA1 | SA2 | SA3 | SA4 | SA5 | SB+ | SB0 | SB1 | SB2 | SB3 | SB4 | SB5 |
|---|---|---|---|---|---|---|---|---|---|---|---|---|---|---|---|---|
| Division by 2 | | | | | | | | | | | | | | | | |
| Negative pulse phase 1 | | X | X | | | | | | | | | X | | | | |
| Negative pulse phase 2 | | X | | | X | | | | | | X | | | | | |
| Division by 3 | | | | | | | | | | | | | | | | |
| Negative pulse phase 1 | | X | X | | | | | | | | | X | | | | |
| Negative pulse phase 2 | | X | | | X | | | | | | | | X | | | |
| Negative pulse phase 3 | | X | | | | X | | | | | X | | | | | |
| Division by 4 | | | | | | | | | | | | | | | | |
| Negative pulse phase 1 | | X | X | | | | | | | | | X | | | | |
| Negative pulse phase 2 | | X | | | X | | | | | | | | X | | | |
| Negative pulse phase 3 | | X | | | | X | | | | | | | | X | | |
| Negative pulse phase 4 | | X | | | | | X | | | | X | | | | | |
| Division by 5 | | | | | | | | | | | | | | | | |
| Negative pulse phase 1 | | X | X | | | | | | | | | X | | | | |
| Negative pulse phase 2 | | X | | | X | | | | | | | | X | | | |
| Negative pulse phase 3 | | X | | | | X | | | | | | | | X | | |
| Negative pulse phase 4 | | X | | | | | X | | | | | | | | X | |
| Negative pulse phase 5 | | X | | | | | | X | | | X | | | | | |
| Division by 6 | | | | | | | | | | | | | | | | |
| Negative pulse phase 1 | | X | X | | | | | | | | | X | | | | |
| Negative pulse phase 2 | | X | | | X | | | | | | | | X | | | |
| Negative pulse phase 3 | | X | | | | X | | | | | | | | X | | |
| Negative pulse phase 4 | | X | | | | | X | | | | | | | | X | |
| Negative pulse phase 5 | | X | | | | | | X | | | | | | | | X |
| Negative pulse phase 6 | | X | | | | | | | X | | X | | | | | |

DEVICE FOR CONTROLLING A CONTINUOUS-ROTATION MOTOR

CROSS-REFERENCE TO RELATED APPLICATIONS

This application claims priority to European Patent Application No. 21217741.4 filed Dec. 24, 2021, the entire contents of which are incorporated herein by reference.

TECHNICAL FIELD OF THE INVENTION

The present invention relates to a control device for controlling the power supply to a continuous-rotation motor. In particular, the invention relates to a timepiece, of the electromechanical type, comprising a continuous-rotation DC motor, which is configured to be incorporated into this timepiece, and the control device.

TECHNOLOGICAL BACKGROUND

The European patent document No. 3663872 discloses a device for controlling the power supply to a continuous-rotation motor, in particular for a horological application, arranged such that it can control the rotation of the rotor of this motor by allowing a variation in the speed of this rotor, which variation is not sudden and which remains within limits which are advantageous for the correct operation of the motor even under unfavourable conditions or following a disturbing event, while controlling, over time, the average number of rotations/revolutions of the rotor per unit of time in order to guarantee a correct indication of the current time.

Various operating modes or regimes are provided for in the aforementioned document, in particular as a function of the load driven by the motor at a given time, the conditions in which the motor is used, in particular the disturbances to which it is subjected, and a time drift in the number of revolutions performed by the motor, from an initial time, relative to a given setpoint value for the average speed of rotation (to which a number of revolutions of the rotor per unit of time corresponds). In one operating mode disclosed herein, at each cycle of the rotor speed regulation method, either a 'low energy' electrical pulse is generated or no pulse is generated. This is a normal operating mode for the motor, i.e. under typical operating conditions, with no major disturbances. It should be noted that the present invention primarily relates to such a normal operating mode or regime in which 'low energy' electrical pulses are successively supplied to the stator of the continuous-rotation motor, in variable numbers per given time period, in order to cause the rotor thereof to rotate.

To generate 'low energy' electrical pulses as mentioned in the European patent document No. 3663872, a person skilled in the art can use in particular the teachings of the European patent document No. 3664280, which discloses an advantageous method for a motor whose stator is formed by two coils and whose rotor is provided with a number of permanent magnets (more generally permanent magnetic poles magnetically coupled with the stator) and the teachings of the European patent document No. 3663871 which describes a particularly efficient voltage divider for dividing a first supply voltage, supplied in particular by a battery supplying a supply voltage of between 1.2 V and 1.5 V, which can fall below this range depending on the state of the battery, into a lower voltage (second supply voltage) supplied to the stator of the motor in the case of the generation of series of 'low energy' electrical pulses having a given constant duration.

The European patent document No. 3663871 aims to reduce the power consumption of the motor, which is achieved by dividing the first supply voltage supplied by the battery into a second, fixed lower voltage that is applied to the terminals of the stator. In other words, the current injected into the inductors (coils) of the stator is minimised and therefore the resistive losses can also be minimised. For example, the disclosed voltage divider divides the first supply voltage supplied by the battery by three. The selection of a voltage divider dividing by three results from considerations regarding the maximum value of the induced voltage in the two coils of the stator, during normal operation of the motor, with a division by three providing a certain margin for the electrical pulses to remain driving, i.e. for the second supply voltage to remain above the maximum induced voltage in the stator, but with a difference between these two voltages that is far smaller than in the case of the first supply voltage being directly applied to the stator.

SUMMARY OF THE INVENTION

The purpose of the present invention is to provide a control device for controlling the power supply to a continuous-rotation motor that is in particular incorporated into a timepiece, which makes it possible for this motor to be powered in the most efficient manner possible while keeping the power consumption thereof to a minimum, at least in a given operating mode or regime.

The present invention relates to a control device for controlling the power supply to a continuous-rotation motor which is formed by a stator and a rotor, the stator comprising at least one supply coil and the rotor carrying at least one permanent magnet magnetically coupled to said at least one supply coil when the rotor is rotating. This control device is arranged to be supplied with electrical power by a power supply unit, supplying a first supply voltage, and it comprises a voltage divider arranged such that it can divide this first supply voltage and supply the stator with a second supply voltage that is lower than the first supply voltage. The control device is arranged to generate, in a given operating mode or regime of the motor, electrical pulses which are driving electrical pulses supplied to the stator with the second supply voltage for driving the rotor, the number of these electrical pulses per defined time interval being variable as a function in particular of the load applied to the motor. The control device comprises a logic circuit which is arranged such that it can: —count the numbers of electrical pulses in successive time periods; —periodically select a voltage value, from among said plurality of different values provided for the second supply voltage, as a function of a counted number of electrical pulses or a succession of counted numbers of electrical pulses; and —control the voltage divider so that this voltage divider supplies the second supply voltage with the selected voltage value when generating electrical pulses after the selection of this voltage value. The logic circuit is arranged such that, with each new selection:

the value of the second supply voltage is reduced, if this value is greater than a given low value, when a last calculated number of electrical pulses or a first increasing function of this last number is below a first determined threshold, or when the succession of calculated numbers of electrical pulses including the last number or of the first increasing function of each of these numbers satisfies a first selection criterion for which at least one number among the succession of numbers or the first increasing function of this number is below a first determined threshold;

the value of the second supply voltage is increased, if this value is less than a given high value, when a last calculated number of electrical pulses or the first increasing function of this last number is above a second determined threshold, or when the succession of calculated numbers of electrical pulses including the last number or of the first increasing function of each of these numbers satisfies a second selection criterion for which at least one number among the succession of numbers or the first increasing function of this number is above a second determined threshold.

In a main embodiment, the logic circuit is arranged such that it can determine in which value range, from among a plurality of determined value ranges, lies a calculated number of electrical pulses or the first increasing function of this number or a second function of a succession of calculated numbers of electrical pulses or of the first increasing function of each of these numbers, and such that it can periodically select a voltage value, from among said plurality of different values provided for the second supply voltage, as a function of the last determined value range.

According to a general alternative to the main embodiment, the plurality of value ranges comprises a first value range having as an upper limit said first threshold, a second value range having as a lower limit said second threshold, and a third value range located between the first and second value ranges and having the first and second thresholds as a lower and upper limit respectively. In this general alternative embodiment, the logic circuit is arranged such that, with each new selection:

when the last calculated number of electrical pulses or the first increasing function of this last number or the second function of the succession of calculated numbers of electrical pulses including the last number or of the first increasing function of each of these numbers is within the first value range, the value of the second supply voltage is decreased if this value is greater than said low value;

when the last calculated number of electrical pulses or the first increasing function of this last number or the second function of the succession of calculated numbers of electrical pulses including the last number or of the first increasing function of each of these numbers is within the second value range, the value of the second supply voltage is increased if this value is less than said high value;

when the last calculated number of electrical pulses or the first increasing function of this last number or the second function of the succession of calculated numbers of electrical pulses including the last number or of the first increasing function of each of these numbers is within the third value range, the value of the second supply voltage is maintained at the value resulting from the previous selection.

In an advantageous embodiment of the invention, the control device comprises a measuring circuit arranged such that it can detect and count, when the rotor is rotating, the alternations or periods of an induced voltage in said supply coil or in said at least one supply coil, the successive time periods each being defined by a given number of successive alternations or periods detected in the induced voltage. The logic circuit is arranged such that it can determine an electrical pulse rate per alternation or period of the induced voltage for each of the successive time periods, the rate being equal to the division of the number of electrical pulses counted in the time period considered by the given number of alternations or periods in this time period, the rate defining the first increasing function of the calculated number of electrical pulses.

According to a preferred embodiment of the invention, the voltage divider comprises a switch circuit arranged between, on the one hand, the stator and, on the other hand, the power supply unit supplying the first supply voltage and the ground of the control device, this voltage divider being arranged such that it can divide the first supply voltage selectively by a plurality of integers greater than one.

In an advantageous alternative to the preferred embodiment, the voltage divider comprises N capacitors $C_n$, n=1 to N, where N is an integer greater than 1. The logic circuit is then arranged such that it can open and close the switches of the switch circuit so as to generate series of said electrical pulses, each comprising S+1 successive electrical pulses, where S is an integer selected between 1 and N, each being generated as follows:

firstly, the power supply unit is connected via the stator, for said pulse duration, to a first capacitor $C_1$ among the N capacitors, to which it supplies the first supply voltage, in order to generate a first electrical pulse of the pulse series considered;

then, when the number S is equal to 2, the stator is connected, for the pulse duration, between the capacitor $C_2$ and the capacitor $C_1$ in order to generate a second electrical pulse; or, when the number S is greater than 2, the stator is successively connected, each time for the pulse duration, between a capacitor $C_J$ and a capacitor $C_{J-1}$ among S capacitors, included in the N capacitors, where J varies from 2 to S, in order to successively generate S−1 electrical pulses;

finally, the stator is connected, for the pulse duration, between the capacitor $C_S$ and the ground in order to generate a last electrical pulse of the series of electrical pulses considered.

The number S can be re-selected by the logic circuit upon each new selection of said voltage value. The plurality of different values provided for the second supply voltage respectively corresponds to the plurality of voltages defined by the first supply voltage divided by m, where m=2 to N+1. Preferably, the N capacitors Cn, n=1 to N, have substantially the same capacitance. In particular, the number N is intended to be between three and six, inclusive.

It should be noted that, in said given operating mode or regime of the motor, for the electrical pulses to be driving at all times, the first supply voltage divided by N+1 is greater than the absolute value of a maximum induced voltage normally generated across the stator.

In a preferred alternative embodiment, the control device is arranged such that each electrical pulse is generated when the induced voltage across the stator is substantially equal to the maximum induced voltage.

In a general alternative embodiment, the electrical pulses have a constant pulse duration in said given operating mode or regime of the motor, at least per time interval extending over tens of revolutions of the rotor.

In a general embodiment, the motor is a DC motor powered by a primary cell or battery.

In a specific alternative embodiment, the control device is arranged to control the average rotational speed of the rotor of the motor such that it equals a given setpoint speed.

The invention further relates to a timepiece comprising a continuous-rotation motor and a device for controlling the power supply to this motor as defined hereinabove.

Thanks to the features of the invention, resistive losses, also referred to as losses due to the Joule effect, can be optimally reduced. It should be remembered that resistive losses result from the fact that the passage of an electric current through a conductor produces heat. Joule's first law states that the heating power $P_J$ generated by an electrical conductor is proportional to the product of its resistance R and the square of the current I, i.e. $P_J = R \times I^2$. However, the useful mechanical power $P_{mec}$ is proportional to the current, not its square. More specifically, the mechanical power $P_{mec} = k_u \times w \times I$, where $k_u$ is the torque constant and w is the rotational speed of the rotor. The invention thus reduces, in a noteworthy manner, the losses due to the Joule effect in the motor while ensuring correct and safe operation of the motor, i.e. while providing sufficient mechanical power in particular for the load to which the motor is subjected. This results in a very efficient operation of the motor, allowing the electrical power consumption thereof to be reduced as much as possible.

BRIEF DESCRIPTION OF THE FIGURES

The invention will be described in more detail hereinafter with reference to the accompanying drawings, given by way of examples that are in no way limiting, wherein:

FIG. 1 diagrammatically shows a continuous-rotation motor and a device for controlling the power supply to this motor;

FIG. 3 shows the induced voltage in each of the two coils of the stator and a measurement signal derived from one of these two induced voltages;

FIG. 4 is a table showing the management of a switch circuit of the control device in a measurement mode;

FIG. 5 is a table showing the management of a switch circuit of the control device in a motor drive mode when generating positive electrical pulses; and FIG. 6 is a table showing the management of said switch circuit of the control device in said motor drive mode when generating negative electrical pulses.

DETAILED DESCRIPTION OF THE INVENTION

Figure 2:
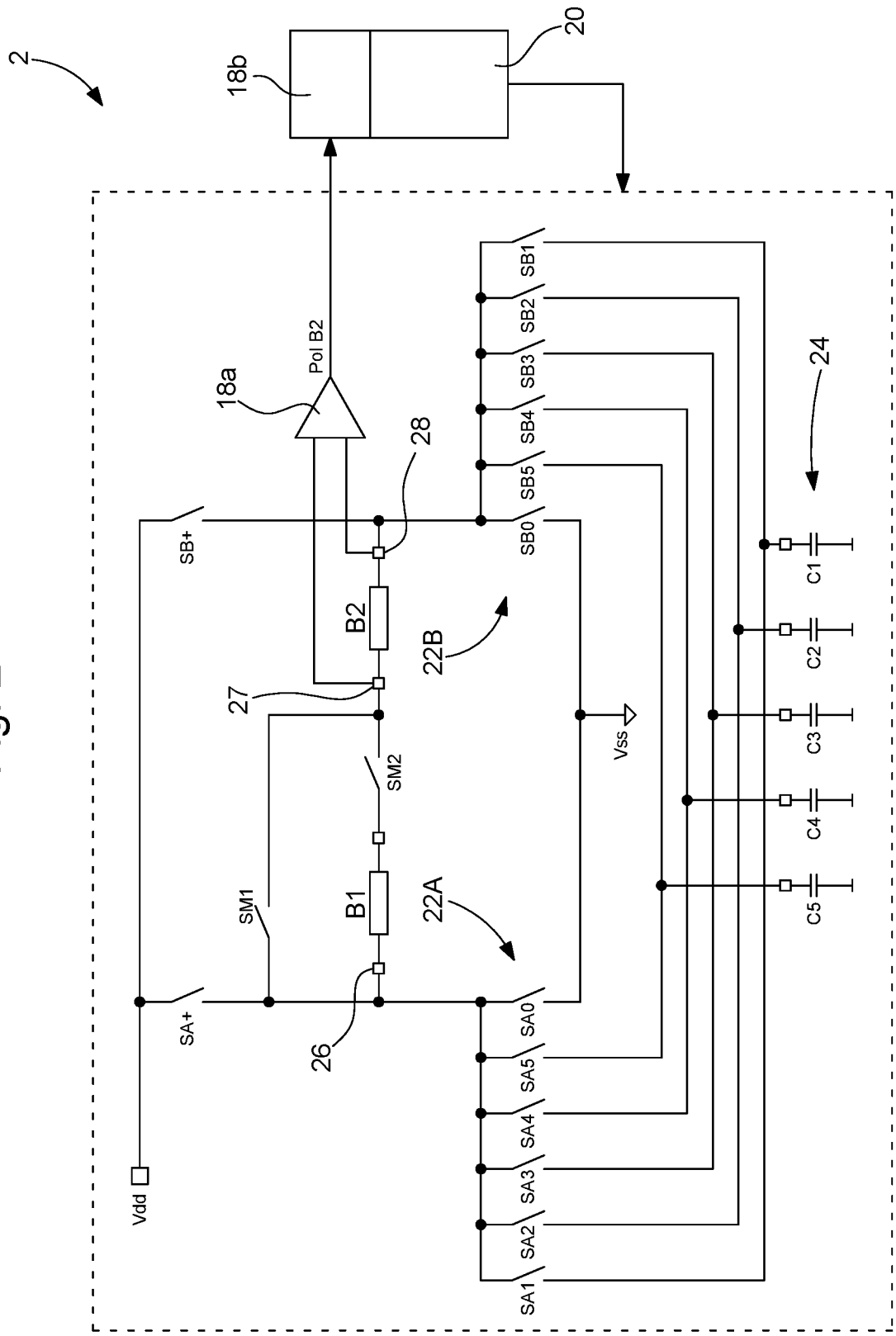
FIG. 2 is an electrical diagram of the stator of said continuous-rotation motor and of an alternative to a preferred embodiment of the device for controlling the power supply to this motor according to the invention.

With reference to the Figures, a preferred embodiment of a control device 2 according to the invention is described hereinbelow for powering a continuous-rotation DC motor 4, i.e. a motor which is powered at a substantially constant voltage when the stator is powered to rotate the rotor.

The continuous-rotation motor 4 is a small motor that can be sized so as to be incorporated into a timepiece. This motor 4 comprises a stator formed by two supply coils B1 and B2, without a magnetic core, and a rotor 6 formed by a shaft on which are mounted a pinion 8, defining a power take-off for a load driven by the motor, and two flanges 10 carrying permanent magnets 12a and 12b. These magnets have alternating polarities on the side of an inner space, between the two flanges, into which the two coils B1 and B2 are partially inserted, such that the magnets are magnetically coupled to the coils of the stator when the rotor rotates.

The two coils B1 and B2 are electrically connected to the control device 2, which comprises a voltage divider, formed by a switch circuit 22 and a plurality of capacitors 24, a logic circuit 20 and a measuring circuit 18. The switch circuit is arranged between the stator on the one hand and the power supply unit 16 and the ground of the control device on the other hand. The control device is arranged to be supplied with electrical energy by the power supply unit 16, in particular a battery, which supplies a first supply voltage $V_{dd}$ to the control device. The voltage divider is arranged such that it can divide the first supply voltage $V_{dd}$ selectively by a plurality of integers that are greater than one, as will be explained in more detail hereinafter.

In the advantageous alternative embodiment shown in FIG. 2, the switch circuit 22 comprises two switches SA+ and SB+, arranged between the supply terminal which receives the first supply voltage of the power supply unit and the two terminals 26 and 28 of the stator respectively, a first series of switches 22A arranged between the first terminal 26 of the stator and respectively the ground and the plurality of capacitors 24, and a second series of switches 22B arranged between the second terminal 28 of the stator and respectively the ground and the plurality of capacitors 24. For a small motor, in particular of the horological type, the switches are typically formed by MOS transistors. In a particular alternative embodiment, the plurality of capacitors is formed by five capacitors C1 to C5. The first series of switches 22A consists of six switches SA0, SA1 to SA5, where the switch SA0 is connected to the ground and the five switches SA1 to SA5 are connected to the capacitors C1 to C5 respectively. The second series of switches 22B consists of six switches SB0, SB1 to SB5, where the switch SB0 is connected to the ground and the five switches SB1 to SB5 are connected to the capacitors C1 to C5 respectively.

The measuring circuit consists of two switches SM1 and SM2 (in a general alternative embodiment, at least one switch is provided), a comparator 18a and a counter 18b associated with the logic circuit 20. The comparator 18a has two inputs connected respectively to the first and second terminals 27 and 28 of the coil B2 and provides, when the rotor rotates, a digital signal Pol_B2 passing alternately between its two states '0' and '1' in a substantially periodic manner (if the rotor speed is constant, the digital signal is periodic). The digital signal Pol_B2 indicates the instantaneous polarity of the induced voltage 32 in the coil B2. In FIG. 3, which further shows the induced voltage 30 in the coil B1, the state '0' of the signal Pol_B2 corresponds to a negative polarity of the induced voltage 32, whereas the state '1' of the signal Pol_B2 corresponds to a positive polarity of this induced voltage. The transitions in the digital signal Pol_B2 between its two states determine passages of the induced voltage by a middle voltage, a voltage below this middle voltage being defined as a negative polarity, whereas a voltage above this middle voltage is defined as a positive polarity of the induced voltage.

The switch SM2 allows the electrical connection between the two coils B1 and B2 arranged in series to be momentarily interrupted, and the switch SM1 allows the first terminal 27 of the coil B2 to be momentarily connected to a reference voltage $V_{Ref}$, which determines the middle voltage of the induced voltage U in the coil B2, this reference voltage being less than the first supply voltage $V_{dd}$ (the operation of a measurement mode, referred to as the 'Measurement Mode', will be described hereafter). The counter 18b is arranged such that it can count, in the digital signal Pol_B2, all the transitions between its two states, respectively corresponding to the two polarities of said induced voltage U, and thus count a number of alternations of this induced voltage, or all the transitions to a given state, between the two states, of the digital signal Pol_B2 and thus count a number of periods of the induced voltage.

The operation of the control device according to the preferred embodiment will be described hereafter. In general, the voltage divider is arranged such that it can divide the first supply voltage $V_{dd}$ and supply the stator with a second supply voltage that is less than this first supply voltage (battery voltage $V_{Bat}$). According to the invention, the voltage divider is arranged such that it can supply the second supply voltage with a plurality of different values. The control device according to the invention is then arranged such that it can generate, in a given operating mode or regime of the continuous-rotation motor, electrical pulses which are driving pulses supplied to the stator with said second supply voltage to drive the rotor. These electrical pulses thus have a variable voltage, which is varied as a function of the criteria set out hereinbelow. The number of electrical pulses per defined time interval is variable, in particular as a function of the load applied to the motor. The logic circuit of the control device is arranged such that it can 1) count the numbers of electrical pulses in successive time periods; 2) periodically select a voltage value, from among the plurality of different values provided for the second supply voltage, as a function of a counted number of electrical pulses or of a succession of counted numbers of electrical pulses; and 3) control the voltage divider so that this voltage divider supplies, after selection of said voltage value, the second supply voltage with this selected voltage value when generating electrical pulses. In general, the logic circuit is arranged such that, upon each new selection of a voltage value for the second supply voltage:
  the value of the second supply voltage is reduced, if this value is greater than a given low value, when a last calculated number of electrical pulses or a first increasing function of this last number is below a first determined threshold, or when the succession of calculated numbers of electrical pulses including the last number or of the first increasing function of each of these numbers satisfies a first selection criterion for which at least one number among the succession of numbers or the first increasing function of this number is below a first determined threshold;
  the value of the second supply voltage is increased, if this value is less than a given high value, when a last calculated number of electrical pulses or the first increasing function of this last number is above a second determined threshold, or when the succession of calculated numbers of electrical pulses including the last number or of the first increasing function of each of these numbers satisfies a second selection criterion for which at least one number among the succession of numbers or the first increasing function of this number is above a second determined threshold.

Examples for the first selection criterion and the second selection criterion are: 1) A number of electrical pulses or the first increasing function of this number is below the first threshold, or respectively above the second threshold in two consecutive time periods. 2) A number of electrical pulses or the first increasing function of this number is below the first threshold, or respectively above the second threshold in two periods out of five successive time periods, more generally in X time periods out of X+Y successive time periods (X and Y being non-zero positive integers).

In a main embodiment, the logic circuit is arranged such that it can determine in which value range, from among a plurality of determined value ranges, lies a calculated number of electrical pulses or the first increasing function of this number or a second function of a succession of calculated numbers of electrical pulses or of the first increasing function of each of these numbers, and such that it can periodically select a voltage value, from among said plurality of different values provided for the second supply voltage, as a function of the last determined value range. The aforementioned second function is, for example, an arithmetic mean of the succession of calculated numbers of electrical pulses or of the first increasing function of each of these numbers. In another example, the second function is the maximum value in the succession of calculated numbers of electrical pulses or of the first increasing function of each of these numbers.

In an advantageous embodiment of the invention, the measuring circuit of the control device is arranged such that it can detect and count, when the rotor is rotating, the alternations or periods of the induced voltage in said supply coil or in said at least one supply coil. The successive time periods are each defined by a given number of successive alternations or periods detected in the induced voltage. By way of example, the number of alternations or periods provided for a time period substantially corresponds to a few seconds or a minute. In general, the time periods have a substantially constant duration, in this case more specifically the same number of alternations or periods of the induced voltage. However, in one particular alternative embodiment, the time periods can vary. For example, short periods and long periods can be alternated, or the length of the time periods can be varied as a function of the result of the one or more previous time periods. The time periods can be continuous or periodic with time intervals during which no measurements are taken therebetween.

The logic circuit is then arranged such that it can determine an electrical pulse rate per alternation or period of the aforementioned induced voltage for each of the successive time periods. By definition, said rate is equal to the division of the number of electrical pulses counted in the time period considered by the given number of alternations or periods in this time period. This rate defines the first increasing function of the calculated number of electrical pulses.

In a particular alternative embodiment, the plurality of value ranges comprises: —a lower range of the electrical pulse rate having the first threshold as the upper limit; —an upper range of said rate having the second threshold as the lower limit; and —an intermediate range of said rate having the first and second thresholds as the lower and upper limits respectively. The logic circuit is arranged such that, upon each new selection of a voltage value for the second supply voltage:
  when the last determined electrical pulse rate or said second function of a succession of determined electrical pulse rates including the last rate is within the lower range, the value of the second supply voltage is decreased if this value is greater than said low value;
  when the last determined electrical pulse rate or the second function of a succession of determined electrical pulse rates including the last rate is within the intermediate range, the value of the second supply voltage is maintained at a value resulting from the previous selection;
  when the last determined electrical pulse rate or the second function of a succession of determined electrical pulse rates including the last rate is within the upper range, the value of the second supply voltage is increased if this value is less than said high value.

For example, the first threshold is equal to 50% and the second threshold is equal to 75%, with the intermediate rate range being between 50% and 75%.

In the preferred embodiment, the control device operates alternately in two modes, i.e. a 'Measurement' mode (first mode) and an 'Electrical Pulse Generation' mode (second mode). These two modes are managed by the logic circuit 20.

In the alternative embodiment described in the figures, the voltage divider comprises five capacitors $C_n$, n=1 to 5, which have substantially the same capacitance. In the considered operating mode or regime of the motor, the first supply voltage divided by the number of capacitors of the plurality of capacitors plus one, i.e. by six, is greater than the absolute value of a maximum induced voltage normally generated across the stator. The control device is arranged such that each electrical pulse is generated when the induced voltage across the stator is substantially equal to the maximum induced voltage, in particular when the induced voltage in the coil B2 is substantially equal, in absolute value form, to $U_{Max}$ (see FIG. 3). It should be noted that in the intervals between the electrical pulses, the control device is set to the 'Measurement' mode so as to be able to determine the passages of the induced voltage U in the coil B2 by the reference voltage $V_{Ref}$. Only when each of the driving electrical pulses is generated to rotate the rotor of the motor, the control device is put into the 'Electrical Pulse Generation' mode. Thus, the 'Electrical Pulse Generation' mode is activated to generate each electrical pulse, and the 'Measurement' mode is activated at least when the induced voltage in the coil B2, which generates the digital signal Pol_B2, approaches the reference voltage $V_{Ref}$ and until it reaches and slightly exceeds this reference voltage, more specifically at least until the transition in the digital signal Pol_B2 in connection with this event has taken place The logic circuit is then arranged such that it can open and close the switches of the switch circuit 22 so as to generate series of electrical pulses, each comprising S+1 successive electrical pulses, where S is an integer selected between 1 and N, N being the number of capacitors which is equal to five in the alternative embodiment shown. It should be noted that the switch (the transistor) is conducting when open and non-conducting when closed. In the tables in FIGS. 5 and 6, which describe the 'Electrical Pulse Generation' mode, a cross indicates that the corresponding switch/transistor is open/conducting, whereas no cross indicates that the corresponding switch/transistor is closed/non-conducting. The same principle applies to the table in FIG. 4, concerning the 'Measurement' mode.

Each series of electrical pulses is generated by the logic circuit controlling the switch circuit 22 as follows:
- firstly, the power supply unit 16 is connected via the stator, for a pulse duration, to the first capacitor $C_1$ among the five capacitors $C_1$ to $C_5$, to which it supplies the first supply voltage $V_{dd}$, in order to thus generate a first electrical pulse of the pulse series considered (phase 1 of each of the possible divisions listed in FIGS. 5 and 6);
- then, when the number S is equal to 2 (division by 3), the stator is connected, for the pulse duration, between the capacitor $C_2$ and the capacitor $C_1$ in order to generate a second electrical pulse (phase 2 of the division by 3); or, when the number S of selected capacitors is greater than 2 (division by 4, by 5 or by 6 depending on whether the number S of capacitors used is selected such that it is equal to 3, 4 or 5, respectively), the stator is connected successively, each time for the pulse duration, between a capacitor $C_J$ and a capacitor $C_{J-1}$ from among S determined capacitors $C_1$ to $C_S$, where J varies from 2 to S, in order to successively generate S−1 electrical pulses (phase 3 of the division by 4; respectively phase 3 and phase 4 of the division by 5; phase 3, phase 4 and phase 5 of the division by 6; each of the phases corresponding to the generation of an electrical pulse);
- finally, the stator is connected, for the pulse duration, between the capacitor $C_S$ and the ground in order to generate a last electrical pulse of the series of electrical pulses considered (last phase of each of the possible divisions listed in the tables in FIGS. 5 and 6).

The number S can be re-selected by the logic circuit upon each new selection of the voltage value for the second supply voltage. It should be noted that the table in FIG. 5 relates to the control of the switch circuit 22 and of the two measuring switches SM1 and SM2 by the logic circuit to generate positive pulses, which are provided when the induced voltage in the stator is positive, preferably close to a maximum positive voltage of this induced voltage, whereas the table in FIG. 6 relates to the control of the switch circuit 22 and of the two measuring switches SM1 and SM2 by the logic circuit to generate negative pulses, which are provided when the induced voltage in the stator is negative, preferably close to a maximum negative voltage of this induced voltage. It should be noted that for a selected value S, positive and negative pulses can be generated alternately in the successive phases that occur, such that electrical pulses can be produced not only in either positive alternations, or negative alternations of the induced voltage, but also alternately in positive alternations and negative alternations.

The voltage divider and the method for controlling same in order to generate driving electrical pulses is truly remarkable, as a steady state is quickly established in which the voltage differences between the first two terminals (located on the stator side) of all pairs of capacitors, among the S selected capacitors, which are simultaneously connected to the two terminals 26 and 28 of the stator respectively, are substantially equal, these voltage differences also being substantially equal to the difference between the supply voltage $V_{dd}$ and the voltage at the first terminal of the capacitor $C_1$ and to the difference between the voltage at the first terminal of the capacitor $C_S$ and the ground (the voltage defined by the ground). Thus, the pulses of each series of electrical pulses are all, in the steady state, generated with the same determined voltage which is selected. The plurality of different possible values for the supply voltage of the stator during the generation of electrical driving pulses corresponds respectively to a plurality of voltages defined by the supply voltage $V_{dd}$ divided by m, where m=2 to N+1, m being equal by definition to S+1. The plurality of different values for the second supply voltage (that applied to the stator of the motor to generate at least one series of electrical pulses, preferably several successive series) are thus respectively equal to $V_{dd}/(S+1)$ where S is a selectable number, variable between 1 and N (number of capacitors of the plurality of capacitors 24), of capacitors used in the voltage divider to divide the supply voltage $V_{dd}$ by S+1 while generating a series of S+1 electrical pulses. This thus provides a very high efficiency voltage divider which allows driving electrical pulses to be generated with a variable and selectable voltage, in the preferred embodiment described here in detail, as a function of ranges of the generated electrical pulse rate per alternation or period of the induced voltage in the stator.

The table in FIG. 4 shows the switches that are open (marked with a cross) in the measurement mode ('Measurement' mode) occurring between electrical pulses, in particular between each pair of successive electrical pulses. At the start of the measurement mode, the switch SM2 is closed (non-conducting) and the switch SM1 is open (conducting). At the end of the measurement mode, the switch SM1 is closed and the switch SM2 is open, such that the two coils of the stator are again connected in series. This is differentiated according to the division provided for the supply voltage (division by S+1, S equals 1 to N=5), in order to have a reference voltage $V_{Ref}$ which is substantially equal to or as close as possible to $V_{dd}/2$ by using the voltages available at the first terminals of the capacitors.

In general, in the preferred embodiment described hereinabove, the electrical pulses have a constant pulse duration. However, in a particular alternative embodiment, the electrical pulses have a pulse duration which is constant per time interval extending over tens of revolutions of the rotor 6. Thus, in this particular alternative embodiment, the amount of electrical power supplied to the motor is intended to be varied while also varying the duration of the electrical pulses in addition to the voltage supplied to the stator, which also allows the value of the supply voltage applied to the stator to be limited, thus also limiting the resistive losses in the motor. The logic circuit, which controls the generation of the electrical pulses, in this alternative embodiment takes account of changes to the duration of the electrical pulses when managing the voltage divider, in particular for counting and/or classifying determined parameters used to select the division level for the voltage divider on the basis of comparable elements.

In an embodiment particularly well suited to the control device according to the invention, this control device is arranged to control the average rotational speed of the rotor of the motor at a given setpoint speed. In particular, this rotational speed control is achieved in a similar way to that described in the European patent document No. 3663872.

The invention further relates to a timepiece, in particular a watch, comprising a continuous-rotation, DC motor and a device for controlling the power supply to this motor according to one or the other of the embodiments of the control device according to the invention.

The invention claimed is:

1. A control device (2) for controlling the power supply to a continuous-rotation motor (4) which is formed by a stator and a rotor (6), the stator comprising at least one supply coil (B1, B2) and the rotor carrying at least one magnet (12a, 12b) arranged so as to be magnetically coupled to said at least one supply coil when the rotor is rotating, this control device being arranged to be supplied with electrical power by a power supply unit (16), supplying a first supply voltage (Vdd), and comprising a voltage divider (22, 24) arranged such that it can divide the first supply voltage and supply the stator with a second supply voltage that is lower than the first supply voltage, this control device being arranged such that it can generate, in a given operating mode or regime of the motor, electrical pulses which are driving pulses supplied to the stator with said second supply voltage for driving the rotor, the number of these electrical pulses per defined time interval being variable as a function in particular of the load applied to the motor;
wherein the voltage divider (22, 24) is arranged such that it can supply said second supply voltage with a plurality of different values and thus said electrical pulses with a variable voltage;
wherein the control device (2) comprises a logic circuit (20) which is arranged such that it can count the numbers of electrical pulses in successive time periods; such that it can periodically select a voltage value, from among said plurality of different values provided for the second supply voltage, as a function of a counted number of electrical pulses or of a succession of counted numbers of electrical pulses; and such that it can control the voltage divider so that this voltage divider supplies the second supply voltage with the selected voltage value when generating electrical pulses after the selection of this voltage value; and
wherein the logic circuit is arranged such that, with each new selection:
the value of the second supply voltage is reduced, if this value is greater than a given low value, when a last calculated number of electrical pulses or a first increasing function of this last number is below a first determined threshold, or when the succession of calculated numbers of electrical pulses including the last number or of the first increasing function of each of these numbers satisfies a first selection criterion for which at least one number among the succession of numbers or the first increasing function of this number is below a first determined threshold;
the value of the second supply voltage is increased, if this value is less than a given high value, when a last calculated number of electrical pulses or the first increasing function of this last number is above a second determined threshold, or when the succession of calculated numbers of electrical pulses including the last number or of the first increasing function of each of these numbers satisfies a second selection criterion for which at least one number among the succession of numbers or the first increasing function of this number is above a second determined threshold.

2. The control device according to claim 1, wherein the logic circuit (20) is arranged such that it can determine in which value range, from among a plurality of determined value ranges, lies a calculated number of electrical pulses or the first increasing function of this number or a second function of a succession of calculated numbers of electrical pulses or of the first increasing function of each of these numbers, and such that it can periodically select a voltage value, from among said plurality of different values provided for the second supply voltage, as a function of the last determined value range.

3. The control device according to claim 2, wherein the plurality of value ranges comprises a first value range having as an upper limit said first threshold, a second value range having as a lower limit said second threshold, and a third value range located between the first and second value ranges and having the first and second thresholds as a lower and upper limit respectively; and wherein the logic circuit (20) is arranged such that, with each new selection:
when the last calculated number of electrical pulses or the first increasing function of this last number or the second function of the succession of calculated numbers of electrical pulses including the last number or of the first increasing function of each of these numbers is within the first value range, the value of the second supply voltage is decreased if this value is greater than said low value;
when the last calculated number of electrical pulses or the first increasing function of this last number or the second function of the succession of calculated numbers of electrical pulses including the last number or of the first increasing function of each of these numbers is within the second value range, the value of the second supply voltage is increased if this value is less than said high value;

when the last calculated number of electrical pulses or the first increasing function of this last number or the second function of the succession of calculated numbers of electrical pulses including the last number or of the first increasing function of each of these numbers is within the third value range, the value of the second supply voltage is maintained at a value resulting from the previous selection.

4. The control device according to claim 2, wherein the control device (2) comprises a measuring circuit (18) arranged such that it can detect and count, when the rotor is rotating, the alternations or periods of an induced voltage in said supply coil (B2) or in said at least one supply coil, the successive time periods each being defined by a given number of successive alternations or periods detected in the induced voltage; and wherein the logic circuit (20) is arranged such that it can determine an electrical pulse rate per alternation or period of the induced voltage for each of the successive time periods, the rate being equal to the division of the number of electrical pulses counted in the time period considered by the given number of alternations or periods in this time period, the rate defining the first increasing function of the calculated number of electrical pulses.

5. The control device according to claim 4, wherein the measuring device is formed by:
a comparator (18a) having two inputs respectively connected to the first and second terminals (27, 28) of said supply coil (B2) and providing, when the rotor (6) rotates, a digital signal (Pol_B2) indicating the instantaneous polarity of the induced voltage in this coil,
at least one first switch (SM1, SM2) allowing the first terminal (27) of said supply coil (B2) to be momentarily connected to a reference voltage that is less than the first supply voltage, and
a counter (18b) arranged to count, in said digital signal, all the transitions between its two states, respectively corresponding to the two polarities of said induced voltage, and thus count a number of alternations of this induced voltage, or all the transitions to a given state of the digital signal and thus count a number of periods of the induced voltage.

6. The control device according to claim 4, wherein the plurality of value ranges comprises a lower range of said rate having said first threshold as the upper limit, an upper range of said rate having said second threshold as the lower limit, and an intermediate range of said rate having the first and second thresholds as the lower and upper limits respectively; and wherein the logic circuit is arranged such that, with each new selection:

when the last determined electrical pulse rate or the second function of a succession of determined electrical pulse rates including the last rate is within the lower range, the value of the second supply voltage is decreased if this value is greater than said low value;

when the last determined electrical pulse rate or the second function of a succession of determined electrical pulse rates including the last rate is within the intermediate range, the value of the second supply voltage is maintained at a value resulting from the previous selection;

when the last determined electrical pulse rate or the second function of a succession of determined electrical pulse rates including the last rate is within the upper range, the value of the second supply voltage is increased if this value is less than said high value.

7. The control device according to claim 6, wherein said first threshold is equal to 50%, said intermediate rate range is between 50% and 75%, and said second threshold is equal to 75%.

8. The control device according to claim 1, wherein the voltage divider comprises a switch circuit (22) arranged between, on the one hand, the stator and, on the other hand, the power supply unit supplying the first supply voltage and the ground of the control device, this voltage divider being arranged such that it can divide the first supply voltage selectively by a plurality of integers greater than one.

9. The control device according to claim 8, wherein the voltage divider comprises N capacitors $C_n$, n=1 to N, where N is an integer greater than 1; wherein the logic circuit is then arranged such that it can open and close the switches of said switch circuit (22) so as to generate series of said electrical pulses, each comprising S+1 successive electrical pulses, where S is an integer selected between 1 and N, each being generated as follows:

firstly, the power supply unit is connected via the stator, for said pulse duration, to a first capacitor $C_1$ among the N capacitors, to which it supplies the first supply voltage, in order to generate a first electrical pulse of the pulse series considered;

then, when the number S is equal to 2, the stator is connected, for the pulse duration, between the capacitor $C_2$ and the capacitor $C_1$ in order to generate a second electrical pulse; or, when the number S is greater than 2, the stator is successively connected, each time for the pulse duration, between a capacitor $C_J$ and a capacitor $C_{J-1}$ among S capacitors, included in the N capacitors, where J varies from 2 to S, in order to successively generate S−1 electrical pulses;

finally, the stator is connected, for the pulse duration, between the capacitor $C_S$ and the ground in order to generate a last electrical pulse of the series of electrical pulses considered;

and wherein the number S can be re-selected by the logic circuit (20) upon each new selection of said voltage value; said plurality of different values provided for the second supply voltage respectively corresponding to the plurality of voltages defined by the first supply voltage divided by m, where m=2 to N+1.

10. The control device according to claim 9, wherein the N capacitors Cn, n=1 to N, have substantially the same capacitance.

11. The control device according to claim 9, wherein the number N is intended to be between three and six, inclusive.

12. The control device according to claim 9, wherein, in said given operating mode or regime of the motor, the first supply voltage divided by N+1 is greater than the absolute value of a maximum induced voltage normally generated across the stator.

13. The control device according to claim 12, wherein this control device is arranged such that each electrical pulse is generated when the induced voltage across the stator is substantially equal to the maximum induced voltage.

14. The control device according to claim 1, wherein the electrical pulses have a constant pulse duration, at least per time interval extending over tens of revolutions of the rotor.

15. The control device according to claim 1, wherein the motor (4) is a DC motor.

16. The control device according to claim 1, wherein this control device is arranged to control the average rotational speed of the rotor (6) such that it equals a setpoint speed.

17. A timepiece comprising a continuous-rotation motor (4) and a control device (2) for controlling the power supply to this motor, wherein the control device is a control device according to claim 1.

18. A timepiece comprising a continuous-rotation motor (4) and a control device (2) for controlling the power supply to this motor, wherein the control device is a control device according to claim 3.

19. A timepiece comprising a continuous-rotation motor (4) and a control device (2) for controlling the power supply to this motor, wherein the control device is a control device according to claim 6.

20. A timepiece comprising a continuous-rotation motor (4) and a control device (2) for controlling the power supply to this motor, wherein the control device is a control device according to claim 9.

* * * * *